May 12, 1964 R. W. LEURGANS 3,133,210

VOLTAGE CONTROLLED DELAY CIRCUIT

Filed May 31, 1962

INVENTOR.
RALPH W. LEURGANS

BY John F Lawler

ATTORNEY 3,133,210
Patented May 12, 1964

3,133,210

VOLTAGE CONTROLLED DELAY CIRCUIT

Ralph W. Leurgans, Los Altos Hills, Calif., assignor to Sylvania Electric Products Inc., a corporation of Delaware Filed May 31, 1962, Ser. No. 199,164
3 Claims. (Cl. 307—88.5)

This invention relates to delay circuits and more particularly to a circuit capable of producing an output pulse after a controllable time interval following the application of an input pulse.

In vacuum tube circuitry this pulse delay function is performed by the phantastron circuit which uses a multigrid tube in associated circuits which divide the cathode current between the screen grid and plate of the tube. Since this circuit cannot be duplicated using a simple triode amplifier there is no direct semiconductor equivalent of the phantastron circuit which uses a single transistor. By using more than one transistor stacked so that the collector current of one is the emitter current of the other, or by using other relatively complex circuits, the necessary partition of current can be performed. However, such circuits are usually complicated due to the problems inherent in correctly biasing stacked transistors. There is, therefore, need for a simple transistorized phantastron circuit providing economy in power, lightness in weight and compatibility with other semiconductor circuitry.

The principle object of this invention is to provide a circuit employing solid state devices that performs the function of a phantastron circuit.

Another object of this invention is to provide a transistorized delay circuit capable of providing an accurately controllable precisely defined delay of extremely short duration.

The foregoing objects are attained with a circuit employing a Miller integrator having a gate transistor connected to the base electrode of a Miller amplifier to determine the conduction state of the amplifier and a tunnel diode switching device connected to the base electrode of the gate transistor to control the conduction state of the gate. A delay control voltage is applied through a catching diode to the collector of the amplifier. The tunnel diode acts as a current comparator and conducts in response to an input trigger pulse to allow the Miller capacitor to discharge for a precise time interval which ends when the peak current limit of the tunnel diode is reached. The length of this time interval is controlled by adjustment of the control voltage to the amplifier collector. The gate transistor is cut off during discharge of the Miller capacitor and conducts when the tunnel diode switches so that the capacitor can recharge for the next cycle.

This invention and the aforementioned and other objects will be more fully understood from the following detailed description, reference being made to the accompanying drawings in which:

FIGURE 3 illustrates typical waveforms, not to scale, at various points in the circuit of FIGURE 1 wherein FIGURE 3*a* is the trigger input pulse, FIGURE 3*b* is the output of the tunnel diode switching device, and FIGURE 3*c* is the output of the Miller integrator.

Figure 1:
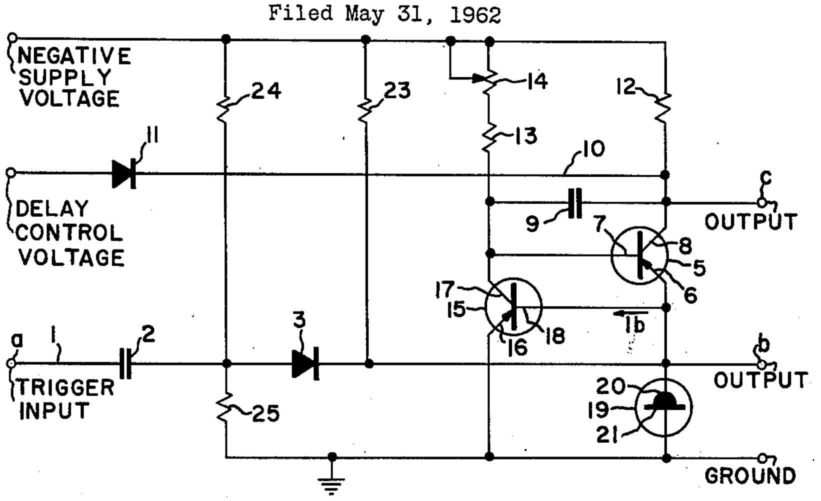
FIGURE 1 is a schematic representation of a circuit embodying the invention.

As shown in FIGURE 1, the Miller integrator circuit comprises transistor amplifier 5, feedback capacitor 9 connected between collector 8 and base 7 of transistor 5, load resistor 12 connected to the junction of capacitor 9 and collector 8 of the amplifier and to the negative supply potential, and the series connected delay resistor 13 and potentiometer 14 connected between the negative supply potential and the junction of capacitor 9 and base 7 of amplifier 5. Collector 8 is connected to a variable delay control voltage source by line 10 and catching diode 11. Emitter 6 is connected to cathode 20 of tunnel diode switching device 19, the anode 21 of which is connected to ground.

A gate transistor 15 has its collector 17 and base 18 connected to base 7 and emitter 6 of amplifier 5, respectively. Gate emitter 16 is connected to ground, and the tunnel diode 19 is thus connected across the base-emitter junction of the transistor 15. A negative potential is supplied to tunnel diode 19 through bias resistor 23. The tunnel diode is switched from a first operating state to a second operating state by application to line 1 of a positive trigger pulse which is coupled through capacitor 2 and disconnect diode 3 to cathode 20 of the tunnel diode. Disconnect diode 3 normally is reverse biased and cut off by the potential on bias resistor 23 and the voltage divider network comprising resistors 24 and 25 connected between the negative supply potential and ground. The delayed output pulse is obtained by differentiating the signal taken from cathode 20 of tunnel diode 19, and the linearly changing ramp voltage output is taken from amplifier collector 8, both signals referenced to ground potential.

Figure 4:
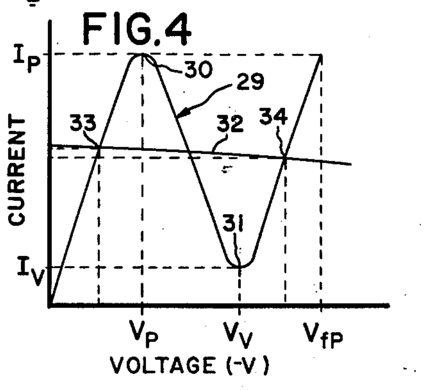
FIGURE 4 is a current-voltage curve showing the tunnel diode characteristics.

A tunnel diode is a semiconductor device which can be adjusted to operate in and switch between two stable conduction states—a high voltage conductor state and a low voltage conduction state. A typical tunnel diode characteristic curve 29 is shown in FIGURE 4. The maximum and minimum current levels are indicated on this curve at 30 and 31, commonly referred to as the peak current and valley current points, respectively.

The particular operating point of the tunnel diode is determined by the supply voltage and circuit characteristics, and is represented in FIGURE 4 by the intersection of load line 32 with the curve 29. If the tunnel diode is operating in its low voltage state, i.e., at stable operating point 33, and current through the diode is caused to increase and exceed peak current point 30, the diode will switch to its high voltage operating point 34. If diode current decreases from point 34 to a value less than that of valley current point 31, the tunnel diode swiches to its low voltage operating point 33. In the embodiment herein described, the current at operating point 33 is adjusted to be approximately one-half of the peak point current 30 and approximately equal to the current at operating point current 34 by making the supply potential much greater than the valley voltage corresponding to the valley point 31.

Figure 3:
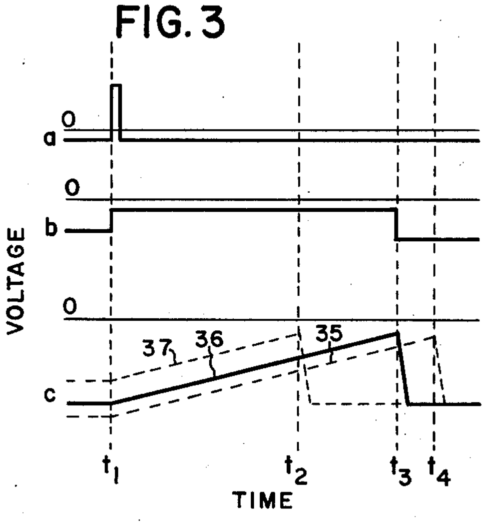

Prior to time $t_1$ in FIGURE 3 tunnel diode 19 is in its high voltage operating state and conducts through gate transistor 15 and bias resistor 23. The potential developed across disconnect diode 3 by current flowing through current voltage divider network 24 and 25 and bias resistor 23 causes the diode to be reverse biased and cut off. The tunnel diode 19 causes gate base 18 to be negative with respect to emitter 16 which, for the PNP transistor shown, causes the gate to conduct and to saturate. The parameters of gate transistor 15, tunnel diode 19 and bias resistor 23 are selected so that the base current $I_b$ required to drive gate transistor 15 into saturation is much less than the peak tunnel diode current, FIGURE 4, point 30, or the tunnel diode high voltage operating point current, FIGURE 4, point 34. Since the base-emitter potential of a transistor driven into saturaation is normally greater than the emitter-collector potential, the voltage on base 18 of gate transistor 15 and on emitter 6 of amplifier 5 is negative with respect to the voltage on gate collector 17 and on amplifier base 7, thus causing amplifier 5, a PNP transistor, to be reverse biased and cut off.

Gate transistor 15 conducts through delay resistor 13 and potentiometer 14 and through feedback capacitor 9 and load resistor 12, the latter conduction path causing capacitor 9 to accumulate a charge determined by the delay control voltage, see FIGURE 3*c*. The delay control voltage, adjustable between zero volts and the negative supply potential, controls the duration of the delay. Waveforms 35, 36 and 37, see FIGURE 3*c*, illustrate the control of the duration of the output by making the delay control voltage less negative. The delay control voltage reverse biases and cuts off catching diode 11. As capacitor 9 continues to charge, the potential of amplifier collector 8 becomes more negative than the delay control voltage. This causes diode 11 to be forward biased so that it conducts and clamps the potential on capacitor 9 to the level of the delay control voltage. The circuit of FIGURE 1 remains in this state, see FIGURE 3, prior to time $t_1$, until a positive input pulse is received on line 1 to initiate discharge of the capacitor.

A positive trigger input pulse at time $t_1$, see FIGURE 3*a*, is applied to line 1 and is coupled through coupling capacitor 2 to forward bias and cause disconnect diode 3 to conduct through tunnel diode bias resistor 23. As the voltage across bias resistor 23 increases, the potential drop across tunnel diode 19 decreases until the current through the tunnel diode reaches and falls below the valley current, FIGURE 4, point 31. Then tunnel diode 19 instantaneously switches from its high voltage operating state to its low voltage operating state, FIGURE 4, point 33, placing a less negative potential on base 18 of gate transistor 15 and driving the transistor to cut off. The potential on gate collector 17 and amplifier base 7 starts to decrease toward the negative supply potential −V but does not reach this value because of the finite charge on capacitor 9. The negative potential on base 7 forward biases amplifier 5 causing it to conduct and initiating discharge of capacitor 9 through load resistor 12. The value of load resistor 12 is selected so that amplifier 5 does not saturate when the sum of the amplifier emitter current and the current through bias resistor 23 equals the tunnel diode peak current, FIGURE 4, point 30. Catching diode 11 is reverse biased and cut off when the potential on capacitor 9 and amplifier collector 8 becomes less negative than the delay control voltage.

Ideally, it is desirable to have the potential on amplifier base 7 remain constant in order to charge capacitor 9 from a constant current source and thus provide more linear discharge of the capacitor. However, in practice, circuits depart from this ideal because the Miller amplifier has finite gain and the input potential must change in order to produce the desired output change. The resultant nonlinearity of the output ramp waveform can be minimized by using a high gain amplifier and by returning the capacitor charging resistor to a potential whose magnitude is large with respect to the input voltage swing. As capacitor 9 discharges, amplifier 5 must supply an increasing current to load resistor 12 which is reflected in a similar increase in the current drawn by amplifier emitter 6. At time $t_3$, see FIGURE 3, current through tunnel diode 19, divided between base resistor 23 and amplifier 5, exceeds the peak point current, FIGURE 4, point 30, and the diode automatically switches from its low voltage to its high voltage operating state. This causes the circuit to revert to the original mode in which it operated prior to time $t_1$, that is, amplifier 5 is cut off, gate transistor 15 conducts and capacitor 9 charges to the delay control voltage. The circuit remains in this state until a positive trigger input pulse of sufficient magnitude is applied to initiate another cycle of operation.

A ramp timing waveform, see FIGURE 3*c*, is obtained from amplifier collector 8. A rectangular timing waveform, see FIGURE 3*b*, appears across tunnel diode 19. A precisely delayed output pulse is obtained by differentiating the output across tunnel diode 19 or of amplifier collector 8. If further pulse shaping is desired, the differentiated waveform can be used to trigger a device such as a blocking oscillator which has been designed to respond to a negative trigger.

Figure 2:
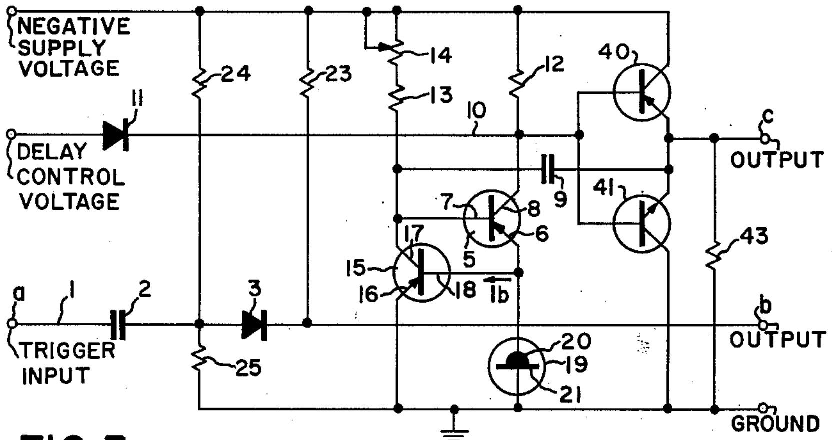
FIGURE 2 is a modification of the circuit of FIGURE 1 to provide faster recovery time of the circuit.

FIGURE 2 illustrates a modification of the embodiment of FIGURE 1 and like reference characters indicate like components on the drawings. A complementary emitter follower consisting of transistors 40 and 41 is inserted in the feedback loop and connected between Miller capacitor 9 and collector 8 of Miller amplifier 5. The emitter follower provides for faster recovery of the circuit because of the relatively low impedance discharge path it provides for capacitor 9. The circuit output is taken across output resistor 43.

The delay circuit shown in FIGURE 2, having components and performance characteristics as listed below, was successfully tested:

| | |
|---|---|
| Diode 3 | D1820. |
| Diode 11 | D1820. |
| Transistor 5 | 2N769. |
| Transistor 15 | 2N769. |
| Transistor 40 | 2N769. |
| Transistor 41 | 2N338. |
| Capacitor 2 | 1000 micromicrofarads. |
| Capacitor 9 | 100 micromicrofarads. |
| Resistor 12 | 1200 ohms. |
| Resistor 13 | 1000 ohms. |
| Resistor 23 | 4700 ohms. |
| Resistor 24 | 470 ohms. |
| Resistor 25 | 47 ohms. |
| Resistor 43 | 470 ohms. |
| Potentiometer 14 | 50,000 ohms. |
| Delay time | 50 nanoseconds to 5 microseconds.* |
| Recovery time | 0.1 microsecond. |
| Tunnel diode switching time | 0.5 nanosecond. |
| Trigger pulse width | 50 nanoseconds. |

* The minimum delay time is limited by the minimum available trigger pulse width. The maximum delay time is limited by the size of the Miller capacitor 9.

What is claimed is:

1. A voltage controlled delay circuit comprising
first and second transistors each having a base, an emitter and a collector,
a voltage supply source,
a delay control voltage source,
a tunnel diode having an anode and a cathode,
a charging capacitor,
means for connecting the cathode of said tunnel diode to the emitter of the first transistor and to the base of the second transistor,
means for connecting the anode of the tunnel diode and the emitter of the second transistor to ground,
means for connecting one side of the capacitor to the base of the first transistor and to the collector of the second transistor,
a variable resistor,
means for connecting said one side of said capacitor to said voltage supply source through said variable resistor,
a fixed resistor,
means for connecting the collector of the first transistor and the other side of said capacitor to said supply source through said fixed resistor,
a clamping diode having an anode connected to said delay control voltage source and a cathode connected to said other side of said capacitor, and
means for applying a positive trigger pulse to the cathode of said tunnel diode whereby to cause said capacitor to discharge for a delay period functional of the delay control voltage, said delay period terminated automatically by said tunnel diode.

2. A voltage controlled delay circuit comprising first and second transistors each having a base, an emitter and a collector, a delay control voltage source, a tunnel diode having an anode and a cathode, a charging capacitor, means for connecting the cathode of said tunnel diode to the emitter of the first transistor and to the base of the second transistor, means for connecting the anode of the tunnel diode and the emitter of the second transistor to ground, means for connecting one side of the capacitor to the base of the first transistor, resistance means connecting one side of the capacitor to the other, a clamping diode having an anode connected to said delay control voltage source and a cathode connected to said other side of said capacitor, and means for applying a positive trigger pulse to the cathode of said tunnel diode whereby to cause said capacitor to discharge for a delay period functional of the delay control voltage, said delay period terminated automatically by said tunnel diode.

3. A voltage controlled delay circuit comprising first and second transistors each having a base, an emitter and a collector, a source of variable voltage, a tunnel diode, a charging capacitor, means for connecting one side of the tunnel diode to the emitter of the first transistor and to the base of the second transistor, means for connecting the other side of the tunnel diode to the emitter of the second transistor, means for connecting one side of the capacitor to the base of the first transistor, a discharge resistor connecting opposite sides of said capacitor, means for connecting said voltage source to said other side of said capacitor and the collector of said first transistor, and means for applying a trigger pulse across said tunnel diode.

No references cited.